(12) United States Patent
Bal et al.

(10) Patent No.: US 11,563,443 B2
(45) Date of Patent: Jan. 24, 2023

(54) HIGH SPEED DATA WEIGHTED AVERAGING (DWA) TO BINARY CONVERTER CIRCUIT

(71) Applicant: STMicroelectronics International N.V.

(72) Inventors: Ankur Bal, Greater Noida (IN); Rupesh Singh, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/374,351

(22) Filed: Jul. 13, 2021

(65) Prior Publication Data

US 2022/0069837 A1 Mar. 3, 2022

Related U.S. Application Data

(60) Provisional application No. 63/072,294, filed on Aug. 31, 2020.

(51) Int. Cl.
| | |
|---|---|
| *H03M 1/66* | (2006.01) |
| *H03K 3/356* | (2006.01) |
| *G06F 5/01* | (2006.01) |
| *H03M 1/68* | (2006.01) |

(52) U.S. Cl.
CPC ............ *H03M 1/662* (2013.01); *G06F 5/015* (2013.01); *H03K 3/356104* (2013.01); *H03M 1/687* (2013.01)

(58) Field of Classification Search
CPC ...... H03M 1/662; H03M 1/687; H03M 1/067; H03M 1/66; H03M 3/464; H03M 7/04; G06F 5/015; G06F 7/509; H03K 3/356104

USPC .......................................... 341/118, 143, 144
See application file for complete search history.

(56) References Cited

U.S. PATENT DOCUMENTS

| | | | |
|---|---|---|---|
| 7,486,210 B1 | 2/2009 | Hong et al. | |
| 7,561,088 B1 | 7/2009 | Ferguson | |
| 7,675,448 B1 * | 3/2010 | Huang | H03M 3/338 341/143 |
| 7,679,539 B2 | 3/2010 | Lee et al. | |
| 7,719,455 B2 | 5/2010 | Kim et al. | |

(Continued)

FOREIGN PATENT DOCUMENTS

CN 102638264 A 8/2012

OTHER PUBLICATIONS

US 8,004,438 B2, 08/2011, Dabag et al. (withdrawn)

(Continued)

*Primary Examiner* — Khai M Nguyen
(74) *Attorney, Agent, or Firm* — Crowe & Dunlevy (57) ABSTRACT

A latch circuit sequentially latches a first data weighted averaging (DWA) data word and then a second DWA data word. A first detector circuit identifies a first bit location in the first DWA data that is associated with an ending of a first string of logic 1 bits in the first DWA data word. A second detector circuit identifies a second bit location in the second DWA data word associated with an ending of a second string of logic 1 bits in the second DWA data word. A DWA-to-binary conversion circuit converts the second DWA data word to a binary word by using the first bit location and second bit location to identify a number of logic 1 bits present in said second DWA data word. A binary value for that binary word that is equal to the identified number is output.

25 Claims, 7 Drawing Sheets

(56) References Cited

U.S. PATENT DOCUMENTS

| | | | |
|---|---|---|---|
| 7,868,807 B2* | 1/2011 | Liu | H03M 1/0665 |
| | | | 341/143 |
| 9,077,369 B1 | 7/2015 | Tsang | |
| 9,214,953 B1 | 12/2015 | Mengad | |
| 9,859,911 B1 | 1/2018 | Chen et al. | |
| 10,050,640 B1 | 8/2018 | Bal et al. | |
| 10,218,380 B1 | 2/2019 | Bal et al. | |
| 10,693,489 B2 | 6/2020 | Roh et al. | |
| 10,763,884 B2 | 9/2020 | Hsiao et al. | |
| 2021/0110852 A1 | 4/2021 | Bal et al. | |

OTHER PUBLICATIONS

Mayur, S. Marinaik: "Design of Novel Multiplexer Based Thermometer to Binary Code Encoder for 4 Bit Flash ADC," 2017 2nd IEEE International Conference on Recent Trends in Electronics Information & Communication Technology (RTEICT), May 19-20, 2017, India, pp. 1006-01009.

Jubay, MC, et al: "Full-Custom Design of Split-Set Data Weighted Averaging With Output Register for Jitter Suppression," 1st International Conference in Applied Physics and Materials Science, IOP Conf. Series: Materials Science and Engineering 79 (2015) 012017, doi: 10.1088/1757-899X/769/1/012017 (9 pages).

\* cited by examiner

HIGH SPEED DATA WEIGHTED AVERAGING (DWA) TO BINARY CONVERTER CIRCUIT

CROSS REFERENCE TO RELATED APPLICATION

This application claims priority from U.S. Provisional Application for Patent No. 63/072,294, filed Aug. 31, 2020, the disclosure of which is incorporated herein by reference.

TECHNICAL FIELD

This disclosure is related to the field of data conversion processing and, in particular, to the conversion of a data weighted averaging (DWA) digital word into a binary digital word in support of high speed data processing operations.

BACKGROUND

Figure 1:
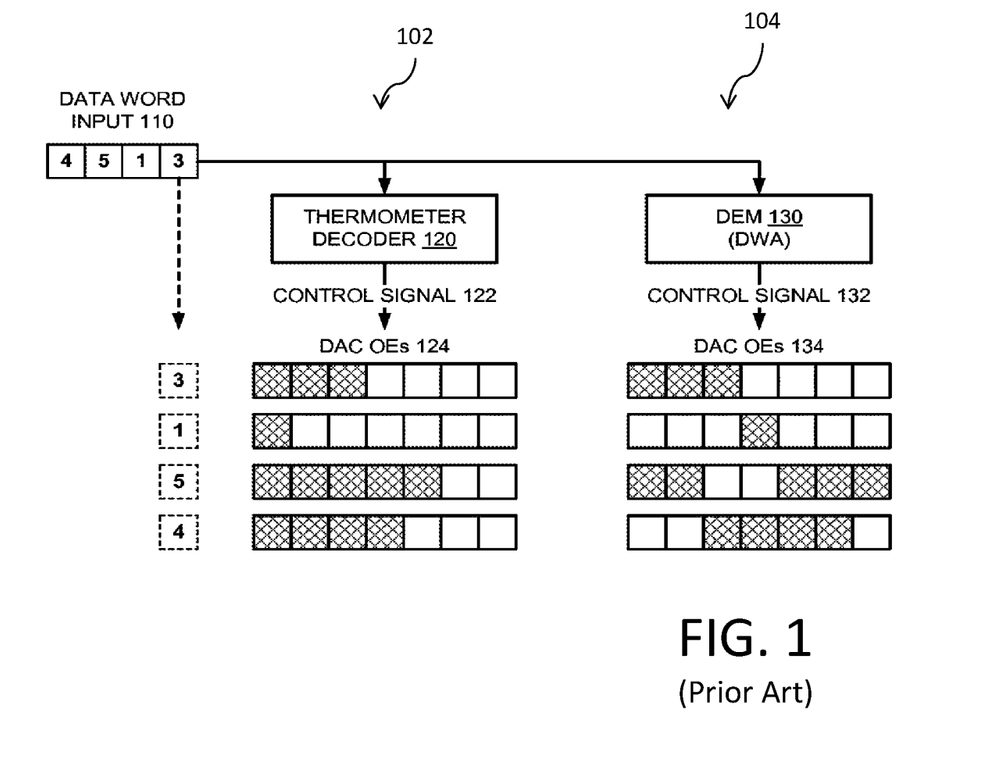
FIG. 1 compares the operation of a data converter that does not employ a data weighted averaging (DWA) algorithm and a data converter that does employ DWA.

It is common for a high speed data converter to employ a data weighted averaging (DWA) algorithm as a solution to achieve first order dynamic element matching (DEM). FIG. 1 illustrates a comparison of the operation of a data converter 102 that does not employ DWA and a data converter 104 that does employ DWA. A data word 110 is received and processed by the converter circuit to selectively actuate the unary output elements (OE) 124, 134 of a digital to analog converter (DAC). In this example, each DAC includes seven unary output elements.

For the data converter 102, the data word 110 is decoded by a thermometer decoder 120 to generate a thermometer control signal 122 whose data bits selectively actuate the unary output elements 124. If the data word has a value of 3 (binary format <0,1,1>), the thermometer decoder 120 decodes that word to generate a seven bit thermometer control signal 122 having a value of <1,1,1,0,0,0,0> which causes the first three unary output elements 124 from the left side to be actuated. Shaded boxes indicate an output element that is activated, while the non-shaded boxes indicate an output element that is deactivated. If the next data word has a value of 1 (binary format <0,0,1>), the thermometer decoder 120 decodes that word to generate a seven bit thermometer control signal 122 having a value of <1,0,0,0,0,0,0> which causes the only the first unary output element 124 from the left side to be actuated. The operation for the next data words with values of 5 and 4 are also shown. It will be noted that this data converter 102 disproportionately actuates the plurality of unary output elements 124 of the DAC in response to the data word input 110. In other words, the unary output elements on the left side of the DAC will be actuated more frequently by control signal 122 than the unary output elements on the right side of the DAC. This will not be a problem in an ideal scenario when all unary output elements 124 of the DAC are identical (i.e., matched). However, in practical designs a mismatch exists and manifests at the output as an increase in the noise floor of the output signal. This negatively impacts the performance of the DAC and results in a reduced signal to noise ratio.

The use of a DWA algorithm by data converter 104, however, ensures that the mismatch across the unary output elements 124 is high-passed and pushed out beyond the band of interest. This is akin to first order noise shaping. The data word 110 is processed by a dynamic element matching (DEM) circuit 130 implementing a data weighted averaging (DWA) algorithm to generate a control signal 132 whose data bits selectively actuate the output elements (OE) 134. If the data word has a value of 3 (binary format <0,1,1>), the DEM circuit 130 decodes that word to generate a seven bit DWA control signal 122 having a value of <1,1,1,0,0,0,0> which causes the first three unary output elements 134 from the left side to be actuated. Shaded boxes indicate an output element that is activated, while the non-shaded boxes indicate an output element that is deactivated. At this point, there is no difference in the operation of the data converter 104 compared to the data converter 102. If the next data word has a value of 1 (binary format <0,0,1>), the DEM circuit 130 decodes that word to generate a seven bit DWA control signal 132 having a value of <0,0,0,1,0,0,0> which causes the next sequential one (i.e., only the fourth) of the unary output elements 134 to be actuated. If the next data word has a value of 5 (binary format <1,0,1>), the DEM circuit 130 decodes that word to generate a seven bit DWA control signal 132 having a value of <1,1,0,0,1,1,1> which causes the next sequential five (i.e., the last three and the first two) of the unary output elements 134 to be actuated (in this case necessitating a wraparound from the right side to the left side). The operation for the next data word with a value 4 is also shown which causes actuation of the next sequential four unary output elements 134. It will be noted that this data converter 104 over time will relatively equally actuate all of the unary output elements 134 of the DAC.

Notwithstanding the mismatch that exists with respect to the unary output elements 134 of the digital to analog converter, the data weighted averaging algorithm causes actuation to be spread relatively equally over all of the unary output elements 134. The noise due to output element mismatch is shaped by the DWA which advantageously averages out the mismatch error in the band of interest.

Figure 2A:
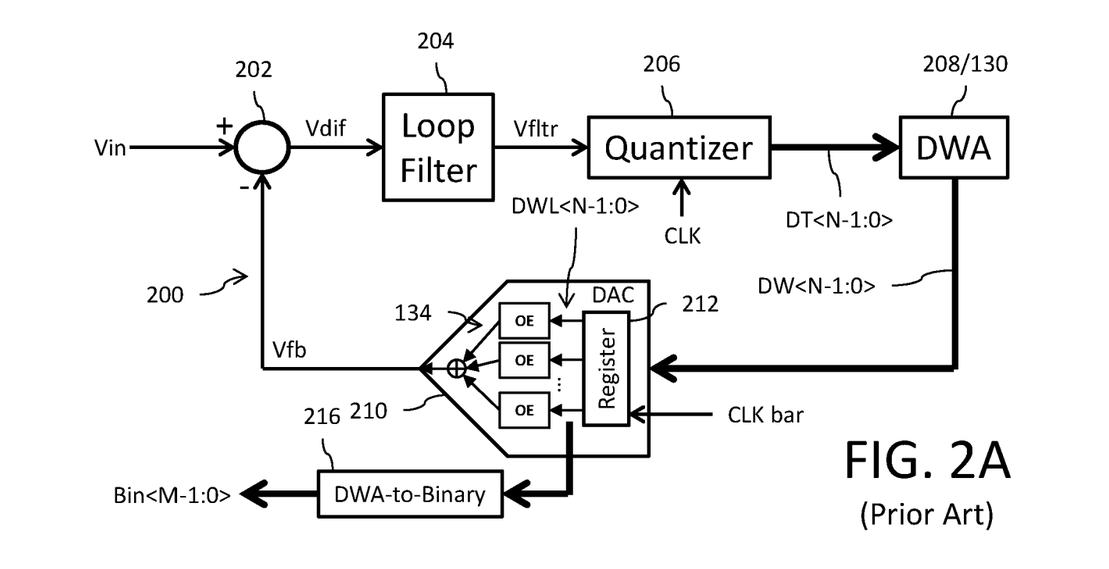
FIGS. 2A and 2B are block diagrams of a continuous time sigma-delta modulator converter circuit utilizing a DWA circuit.

Reference is now made to FIG. 2A which shows a block diagram of a continuous time sigma-delta modulator circuit 200. An analog input voltage Vin is received at a first input of a summation circuit 202. A second input of the summation circuit 202 receives an analog feedback voltage Vfb. The summation circuit 202 functions to determine a difference between the analog input voltage Vin and the analog feedback voltage Vfb and generate an analog difference voltage Vdif (i.e., Vdif=Vin−Vfb). A loop filter 204 which implements, for example, an integration function, receives the analog difference voltage Vdif and outputs an analog filtered voltage Vfltr. A multi-bit quantization circuit 206 quantizes the analog filtered voltage Vfltr to generate a multi-bit thermometer data word DT on the leading edge of the clock signal CLK (i.e., the multi-bit quantization circuit 206 is clocked by the clock signal). The multi-bit thermometer data word DT is applied to a data weighted averaging (DWA) circuit 208. The data word DT corresponds to the data word 110 of FIG. 1, and the DWA circuit 208 corresponds to the DWA circuit 130 of FIG. 1. The DWA circuit 208 outputs an N-bit DWA data word DW<N−1:0> that may be processed in a manner well known to those skilled in the art (for example, decimated and digitally filtered) to generate a digital signal corresponding to a conversion of the analog input voltage Vin to digital. The data word DW corresponds to the control signal 132 of FIG. 1. In a feedback loop, the data word DW is input to a digital-to-analog converter (DAC) circuit 210 which converts the data word DW to generate the analog feedback voltage Vfb. The digital-to-analog converter circuit 210 includes an input register 212 that latches the data word DW on the trailing edge of the clock signal CLK (i.e., the input register 212 is clocked by the logical inverse (CLK bar) of the clock signal). A plurality of unary output elements (OE) 134 are actuated by the bits of the latched data word DW and the signals (for example, currents) generated by the output elements are summed to produce the analog feedback voltage Vfb.

The data word DW forms the output of the modulator circuit 200 and may be further processed in a number of ways known to those skilled in the art. Of specific interest is a processing of the data word DW, which as noted above is a DWA digital signal, for conversion to output a binary signal. This is accomplished using a DWA-to-Binary converter circuit 216 coupled to the output of the register 212 and configured to convert the N-bit latched data word DWL from DWA format to an M-bit data word in binary format (Bin<M–1:0>). This DWA-to-Binary converter circuit 216 is known in the art as a "ones counter" since the binary value corresponding to the data word DW, DWL is simply equal to the number of bits of the N-bit data word DW, DWL which are set at logic 1. Consider, for example, the data word DW (control signal 132) having a value of <1,1,0,0,1,1,1>; there are five bits set at logic 1, with a value of 5 and a binary form of <1,0,1> for the M-bit data word (Bin<M–1:0>) generated by the ones counting functionality of the DWA-to-Binary converter circuit 216.

Figure 3:
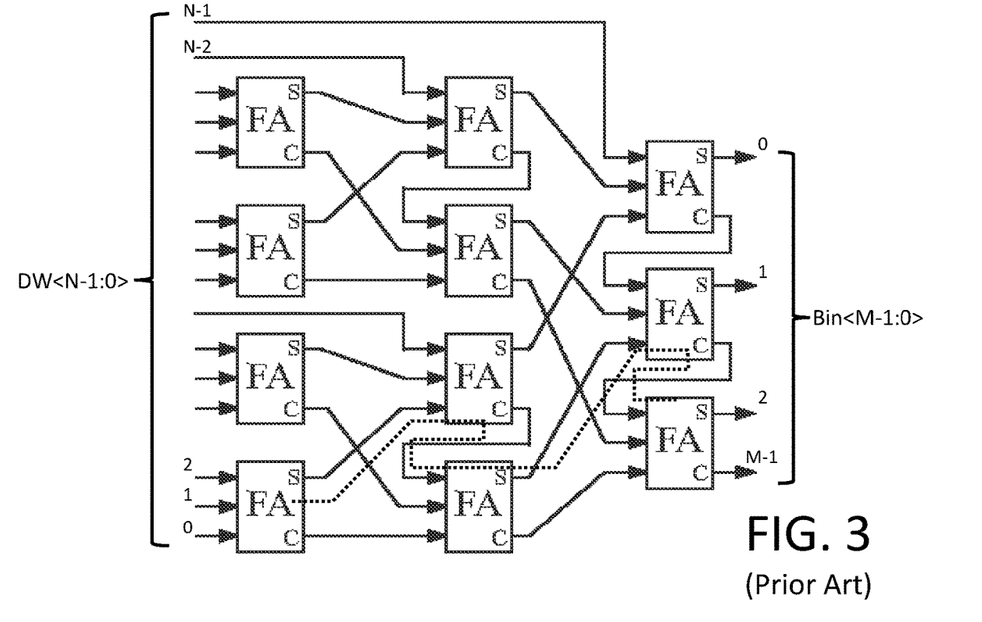
FIG. 3 is a block diagram of a prior art DWA-to-Binary converter circuit.

DWA-to-Binary converter circuits are well known in the art. FIG. 3 shows an example of a well-known DWA-to-binary converter. This converter circuit is formed by a plurality of full adder (FA) circuits that are interconnected with each other. Each full adder has a three-bit input and a two-bit output, where the two bits of the output are a sum (S) bit and a carry (C) bit for the addition performed on the logic states of the signals received by the three-bit input. The converter circuit receives the N-bit data word DW<N–1:0> and outputs the M-bit data word (Bin<M–1:0>).

There is a concern with using the converter circuit shown in FIG. 3 as the DWA-to-Binary converter circuit 216 in FIG. 2A in very high speed modulators (for example, for speeds at or in excess of 2 GHz). The reason for this relates to the length of the critical path for the converter circuit which must pass through five full adder (FA) circuits. An example of this critical path is shown with a dotted line. The signal processing operation must be designed to account for the worst case delay and the critical path of the converter circuit 216 contributes to that delay.

A need therefor exists for a high speed DWA-to-Binary converter circuit.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In an embodiment, a circuit converts a data weighted averaging (DWA) data word into a binary word. The circuit comprises: a first detector circuit configured to identify a first bit location in said DWA data word where a string of logic 1 bits begins; a second detector circuit configured to identify a second bit location in said DWA data word where said string of logic 1 bits ends; and a logic circuit. The logic circuit comprises: a plurality of first multiplexers, each first multiplexer having a selection input receiving said first bit location and each first multiplexer having inputs receiving a different order of binary values which represent possible numbers of logic 1 bits present in the DWA word; and a second multiplexer having inputs coupled to outputs of the first multiplexers of said plurality of first multiplexers and having a selection input receiving said second bit location.

In an embodiment, a method comprises: receiving a data weighted averaging (DWA) data word; identifying a first bit location in said DWA data word where a string of logic 1 bits begins; identifying a second bit location in said DWA data word where said string of logic 1 bits ends; selecting a sequence of binary values which represent possible numbers of logic 1 bits present in the DWA word starting from the identified first bit location; choosing one binary value from said sequence using the identified a second bit location; and outputting the chosen binary value as a binary word identifying a number of logic 1 bits which are present in said DWA data word.

In an embodiment, a method comprises: receiving a first data weighted averaging (DWA) data word; processing said first DWA data word to identify a first bit location associated with an ending of a first string of logic 1 bits in said first DWA data word; generating a second DWA data word including a second string of logic 1 bits that begins at said first bit location; processing said second DWA data word to identify a second bit location associated with an ending of the second string of logic 1 bits in said second DWA data word; using the first bit location and second bit location to identify a number of logic 1 bits present in said second DWA data word; and outputting a binary value which is equal to said identified number.

In an embodiment, a circuit comprises: a latch circuit configured to first latch a first data weighted averaging (DWA) data word and then latch a second DWA data word; a first detector circuit configured to identify a first bit location in said first DWA data associated with an ending of a first string of logic 1 bits in said first DWA data word; a second detector circuit configured to identify a second bit location in said second DWA data word associated with an ending of a second string of logic 1 bits in said second DWA data word; and a DWA-to-binary conversion circuit configured to convert second DWA data word to a binary word by using the first bit location and second bit location to identify a number of logic 1 bits present in said second DWA data word and outputting a binary value for said binary word which is equal to said identified number.

DETAILED DESCRIPTION

In the following detailed description and the attached drawings, specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 2B:
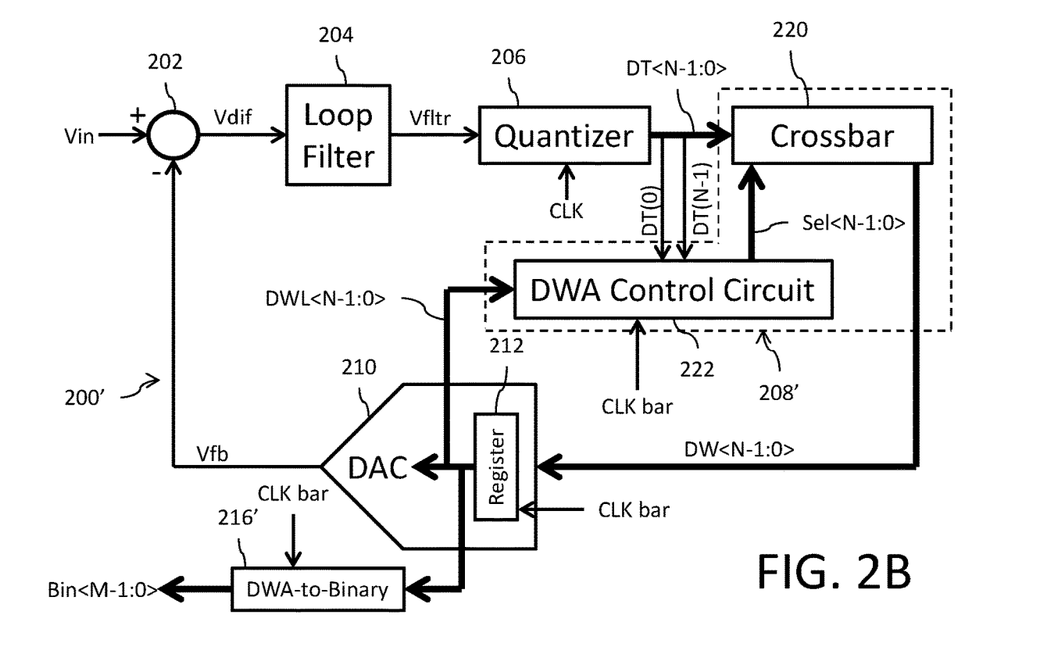

Reference is now made to FIG. 2B which shows a block diagram of a continuous time sigma-delta modulator circuit 200'. Like reference numbers refer to like or similar components of the circuit 200 shown in FIG. 2A. An analog input voltage Vin is received at a first input of a summation circuit 202. A second input of the summation circuit 202 receives an analog feedback voltage Vfb. The summation circuit 202 functions to determine a difference between the analog input voltage Vin and the analog feedback voltage Vfb and generate an analog difference voltage Vdif (i.e., Vdif=Vin−Vfb). A loop filter 204 which implements, for example, an integration function, receives the analog difference voltage Vdif and outputs an analog filtered voltage Vfltr. A multi-bit quantization circuit 206 quantizes the analog filtered voltage Vfltr to generate a multi-bit input data word DT on the leading edge of the clock signal CLK (i.e., the multi-bit quantization circuit 206 is clocked by the clock signal). The multi-bit input data word DT is applied to a data weighted averaging (DWA) circuit 208'. The DWA circuit 208' outputs a data word DW on the trailing edge of the clock signal CLK (i.e., in response to the logic inverse clock CLK bar) that may be processed in a manner well known to those skilled in the art (for example, decimated and digitally filtered) to generate a digital signal corresponding to a conversion of the analog input voltage Vin. In a feedback loop, the data word DW is input to a digital-to-analog converter circuit 210 which converts the data word DW to generate the analog feedback voltage Vfb. The digital-to-analog converter circuit 210 includes an input register 212 that latches the data word DW on the trailing edge of the clock signal CLK (i.e., the input register 212 is clocked by the logical inverse (CLK bar) of the clock signal). The latched output of the data word DWL provides the digital information that is converted by the digital-to-analog converter circuit 210 to generate the analog feedback voltage Vfb (for example, through the selective actuation of unary output elements (OE)). The latched data word DWL output by the modulator circuit 200' is further processed by a DWA-to-Binary converter circuit 216' that converts the N-bit data word DW, DWL from DWA format to an M-bit data word in binary format (Bin<M−1:0>).

Figure 4:
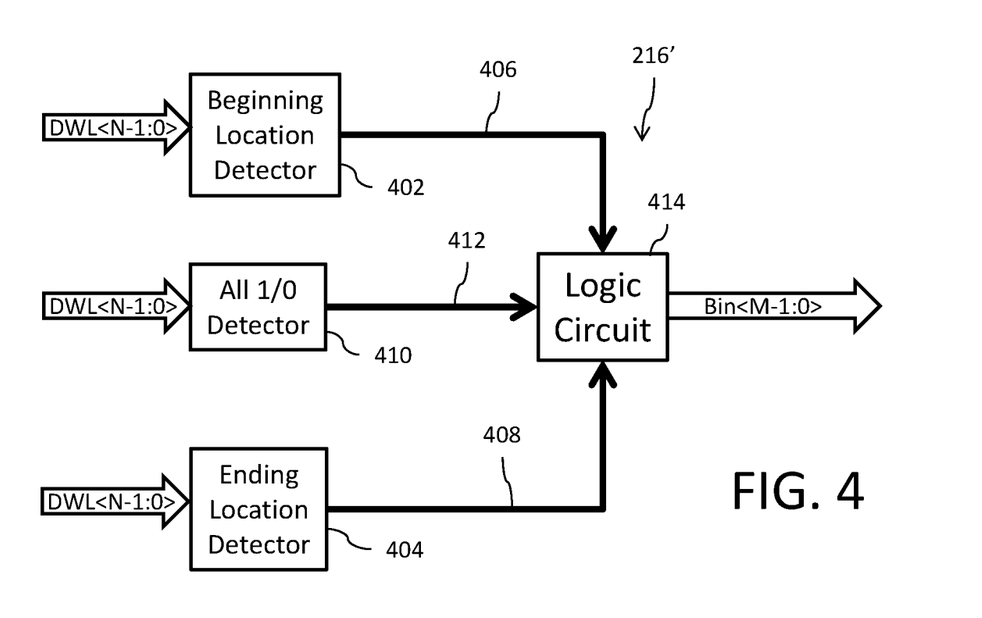
FIG. 4 is a block diagram of a DWA-to-Binary converter circuit.

Reference is now made to FIG. 4 which shows a block diagram of the DWA-to-Binary converter circuit 216'. The circuit 216' includes a first detector circuit 402 for detecting a beginning of a string of logic 1 bits in the latched N-bit DWA data word DWL<N−1:0>, a second detector circuit 404 for detecting an ending of the string of logic 1 bits in the latched N-bit DWA data word DWL<N−1:0>, and a third detector circuit 410 for detecting the presence of all logic 1 or all logic 0 bits in the latched N-bit DWA data word DWL<N−1:0>.

The beginning bit location 406 identified by the first detector circuit 402, the ending bit location 408 identified by the second detector circuit 404, and the all logic 1/0 bit detection 412 identified by the third detector circuit 410 are used as selection signals by a selection logic circuit 414 to select one binary value from the N+1 possible binary values (i.e., Bin(0) to Bin(N)) as the output M-bit data word (Bin<M−1:0>).

The first detector circuit 402 processes the latched N-bit DWA data word DWL<N−1:0> to identify where the string of logic 1 bits in a preceding N-bit DWA data word DW<N−1:0> transitions to logic 0 from logic 1 and thus identify the bit location where the string of consecutive logic 1 bits in the immediately following N-bit DWA data word DW<N−1:0> will begin. For example, consider the example where the preceding N-bit DWA data word DW has a value of <0,0,0,0,1,1,0>. The bit location of where the string of logic 1 bits transitions to logic 0 from logic 1 is at the 4th bit (i.e., DW(3)), and thus the string of logic 1 bits in the immediately following N-bit DWA data word DW<N−1:0> will begin at that 4th bit. The signal 406 specifies that beginning bit location (i.e., the bit location associated with the ending of the preceding DWA data word).

The second detector circuit 404 processes the latched N-bit DWA data word DWL<N−1:0> to identify the bit location in that immediately following N-bit DWA data word DW<N−1:0> where the string of consecutive logic 1 bits ends (i.e., the bit location where the string of logic 1 bits transitions from logic 1 to logic 0). For example, consider the example where the immediately following N-bit DWA data word DW has a value of <0,1,1,1,0,0,0> (note the starting location at the 4th bit). The bit location where the string of logic 1 bits ends (transitions from logic 1 to logic 0) is at the 6th bit (i.e., DW(5)). The signal 408 specifies that ending bit location (i.e., the bit location associated with the ending of the immediately following DWA data word).

The third detector circuit 410 determines whether the latched N-bit DWA data word DWL<N−1:0> for that immediately following N-bit DWA data word DW<N−1:0> either: i) includes bits that are only logic 0; or ii) includes bits that are only logic 1. The circuit 410 accordingly addresses the special cases where there is no readily detectable beginning or ending for the string because all bits of the N-bit DWA data word DW<N−1:0> are logic 0 or logic 1, respectively. The signal 412 specifies whether and which one of the all logic 1 or all logic 0 bit cases is present.

The principle of operation for the converter circuit 216' is as follows: a) for an N-bit DWA data word DW<N−1:0>, there are only N+1 possible binary values; b) take the special cases and: b1) if all bits in that N-bit data word DW<N−1:0> are logic 0, then a binary value with all bits at logic 0 is output as the M-bit data word (Bin<M−1:0>); b2) if all bits in that N-bit data word DW<N−1:0> are logic 1, then a binary value with all bits at logic 1 is output as the M-bit data word (Bin<M−1:0>) are logic 1; and c) for the other N−1 cases: c1) from the location of the beginning of the string of logic 1 bits in the N-bit DWA data word DW<N−1:0>, there are only N−1 possible bit patterns; c2) using the location of the ending of the string of logic 1 bits in the N-bit DWA data word DW<N−1:0>, select one of those N−1 possible bit patterns; and c3) the binary value which corresponds to the selected bit pattern is output as the M-bit data word (Bin<M−1:0>).

The foregoing may be better understood by considering some specific examples.

Consider first the special case where the third detector circuit 410 determines that the immediately following N-bit DWA data word DW<N−1:0>, where N=7, includes bits that are only logic 0 (i.e., <0,0,0,0,0,0,0>). The signal 412 specifies detection of this all logic 0 bit case, and a selection of the M-bit data word (Bin<M−1:0>) as <0,0,0>=0 is made.

Consider next the special case where the third detector circuit 410 determines that the immediately following N-bit DWA data word DW<N−1:0>, where N=7, includes bits that are only logic 1 (i.e., <1,1,1,1,1,1,1>). The signal 412 specifies detection of this all logic 1 bit case, and a selection of the M-bit data word (Bin<M−1:0>) as <1,1,1>=7 is made.

Consider now the situation where the first detector circuit 402 processes the N-bit DWA data word DW<N−1:0>, where N=7, and identifies that the 4th bit (DW(3)) is the location in the N-bit DWA data word DW<N−1:0> where the string of consecutive logic 1 bits starts. From this identification, and ignoring the all logic 0 and all logic 1 special cases which are otherwise detected as noted above, there are N−1=6 possible bit patterns for the N-bit DWA data word DW<N−1:0> as follows: <0,0,0,1,0,0,0>, <0,0,1,1,0, 0,0>, <0,1,1,1,0,0,0>, <1,1,1,1,0,0,0>, <1,1,1,1,0,0,1>, and <1,1,1,1,0,1,1> which correspond to the values 1-6 (binary <0,0,1> to binary <1,1,0>). If the second location detector circuit 404 processes the N-bit DWA data word DW<N−1: 0> and identifies the 6th bit (DW(5)) as the location in the N-bit DWA data word DW<N−1:0> where the string of consecutive logic 1 bits ends, this corresponds to only one possible bit pattern of <0,1,1,1,0,0,0> for the N-bit DWA data word DW<N−1:0> which includes three logic 1 bits. The binary value <0,1,1>=3 corresponding to this bit pattern is then selected by the selection logic circuit 414 for output as the M-bit data word (Bin<M−1:0>).

With reference once again to FIG. 2B, the DWA circuit 208' includes a crossbar switch matrix 220 and a DWA control circuit 222. The data inputs of the crossbar switch matrix 220 receive a stream of multi-bit input data words DT<N−1:0> in a thermometer coded format (where each data word DT<N−1:0> in the stream may be supplied, for example, from the quantizer circuit 206 clocked by the data clock signal CLK). The outputs of the crossbar switch matrix 220 provide a corresponding stream of multi-bit output data words DW<N−1:0> that are data weighted averaging conversions of the thermometer coded multi-bit input data words DT<N−1:0>. The DWA control circuit 222 receives the most significant bit DT(N−1) and the least significant bit DT(0) of each multi-bit input data word DT<N−1:0> as well as the latched multi-bit output data word DWL<N−1:0> from the register 212 (which represents the preceding data word DW) and the logical inverse (CLK bar) of the data clock signal CLK, and operates to generate a multi-bit selection signal Sel<N−1:0> that is applied to the control inputs of the crossbar switch matrix 220. The crossbar switch 220 operates in response to the multi-bit selection signal Sel<N−1:0> to selectively map switch inputs to switch outputs to effectuate the data weighted averaging conversion and achieve dynamic element matching (DEM).

Figure 5:
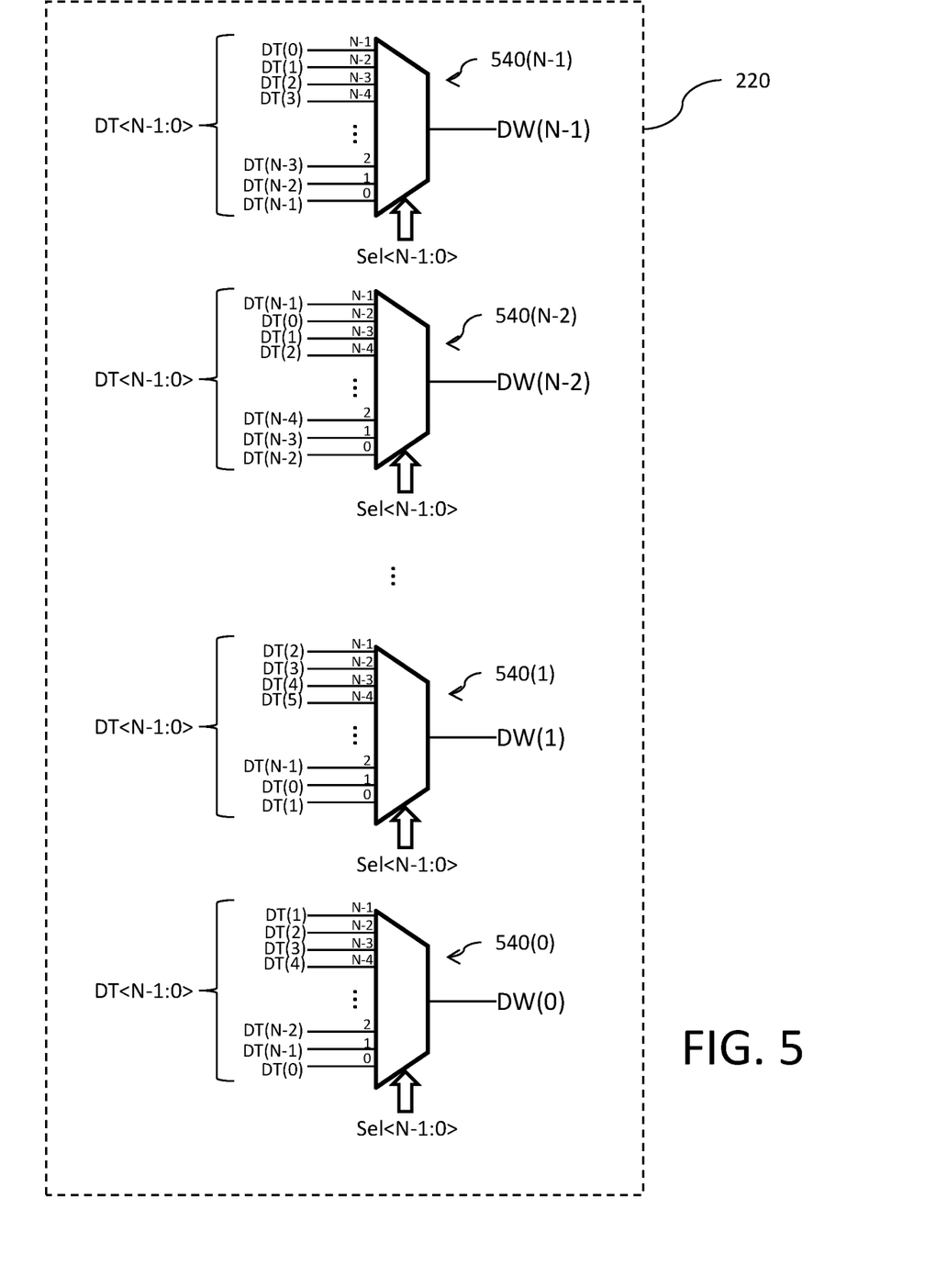
FIG. 5 is a logical representation using multiplexers of a crossbar switch as used in the DWA circuit of the converter circuit shown in FIG. 4.

The physical configuration of a crossbar switch matrix 220 is shown in FIG. 5. The operation of the crossbar switch matrix 220 may be logically represented by N multiplexers 540(0) to 540(N−1), wherein each multiplexer 540 is an N:1 multiplexer. The bits of the received multi-bit input data word DT<N−1:0> are identified as DT(N−1), DT(0). The bits of the generated multi-bit output data word DW<N−1: 0> are identified as DW(N−1), DW(0). The selection control input of each multiplexer 540 receives the multi-bit selection signal Sel<N−1:0>. It will be noted that the wrap around sequence order for the bits of the multi-bit input data word DT<N−1:0> at the inputs of each multiplexer is different. As an example, for multiplexer 540(N−1), the order of the bits of the multi-bit input data word DT<N−1:0> at the input is DT(N−1), DT(N−2), DT(0). For multiplexer 540(N−2), the order of the bits of the multi-bit input data word DT<N−1:0> at the input is DT(N−2), DT(N−3), . . . , DT(0), DT(N−1). For multiplexer 540(1), the order of the bits of the multi-bit input data word DT<N−1:0> at the input is DT(1), DT(0), DT(N−1), DT(3), DT(2). For multiplexer 540(0), the order of the bits of the multi-bit input data word DT<N−1:0> at the input is DT(0), DT(N−1), DT(N−2), DT(2), DT(1). Those skilled in the art will recognize that the connection of the sequence of bits of the multi-bit input data word DT<N−1: 0> is effectively barrel-shifted across the N multiplexers 540(0) to 540(N−1). The effect of this is that the crossbar switch matrix operates to selectively connect bits of the multi-bit input data word DT<N−1:0> to bits of the multi-bit output data word DW<N−1:0> with a selectable barrel shift position selected by the value of the multi-bit selection signal Sel<N−1:0>.

The DWA control circuit 222 generates the multi-bit selection signal Sel<N−1:0> in a manner such that only one bit of the N bits in the selection signal can be asserted (for example, at logic 1) at a time, while all other bits are deasserted (for example, at logic 0). The N multiplexers 540(0) to 540(N−1) respond to the asserted bit of the multi-bit selection signal Sel<N−1:0> by selectively connecting the multiplexer input (reference numbers 0 to N−1) which corresponds to the asserted bit to the multiplexer output. The single asserted bit of the multi-bit selection signal Sel<N−1:0> specifies the barrel-shifted positional relationship between the sequence of bits of the multi-bit input data word DT<N−1:0> and the sequence of bits of the multi-bit output data words DW<N−1:0>. This may be better understood by reference to some examples.

Consider first the multi-bit selection signal Sel<N−1:0> with the value of <0,0, . . . , 0,1>, where only Sel(0)=1. In response to this value of the multi-bit selection signal Sel<N−1:0>, multiplexer 540(0) will connect DT(0) to the output DW(0), multiplexer 540(1) will connect DT(1) to the output DW(1), multiplexer 540(N−2) will connect DT(N−2) to the output DW(N−2), and multiplexer 540(N−1) will connect DT(N−1) to the output DW(N−1).

Consider now the multi-bit selection signal Sel<N−1:0> with the value of <0,0 . . . , 1,0>, where only Sel(1)=1. In response to this value of the multi-bit selection signal Sel<N−1:0>, multiplexer 540(0) will connect DT(N−1) to the output DW(0), multiplexer 540(1) will connect DT(0) to the output DW(1), multiplexer 540(N−2) will connect DT(N−3) to the output DW(N−2), and multiplexer 540(N−1) will connect DT(N−2) to the output DW(N−1).

For the multi-bit selection signal Sel<N−1:0> with the value of <0,1, . . . , 0,0>, where only Sel(N−2)=1. In response to this value of the multi-bit selection signal Sel<N−1:0>, multiplexer 540(0) will connect DT(2) to the output DW(0), multiplexer 240(1) will connect DT(3) to the output DW(1), multiplexer 540(N−2) will connect DT(0) to the output DW(N−2), and multiplexer 540(N−1) will connect DT(1) to the output DW(N−1).

Lastly, if the multi-bit selection signal Sel<N−1:0> has the value of <1,0, . . . , 0,0>, where only Sel(N−1)=1. In response to this value of the multi-bit selection signal Sel<N−1:0>, multiplexer 540(0) will connect DT(1) to the output DW(0), multiplexer 540(1) will connect DT(2) to the output DW(1), multiplexer 540(N−2) will connect DT(N−1) to the output DW(N−2), and multiplexer 540(N−1) will connect DT(0) to the output DW(N−1).

The operation of the crossbar switch matrix 220 for connecting bits of the multi-bit input data words DT<N−1:0> to bits of the multi-bit output data words DW<N−1:0> may be mathematically represented by the following operation: DW(n,k)=DT(mod(N+n−k,N)), wherein n, k Å(0,N−1), n is the output, and k is the selection such that DW(n,k) is the switch address connecting input DT((N+n−k)modulo N) to output DW(n).

Consider the first example given above where the multi-bit selection signal Sel<N−1:0> has the value of <0,0, . . . , 0,1>, where only Sel(0)=1 and thus k=0. For n=0 and N=15, the output bit DW(0) will be connected to the input bit DT(0) because (15+0−0/15=1 remainder 0 and thus the modulus is 0). For n=1 and N=15, the output bit DW(1) will be connected to the input bit DT(1) because (15+1−0/15=1 remainder 1 and thus the modulus is 1). The foregoing corresponds to the result noted above where multiplexer 540(0) will connect DT(0) to the output DW(0), multiplexer 540(1) will connect DT(1) to the output DW(1), multiplexer 540(N−2) will connect DT(N−2) to the output DW(N−2), and multiplexer 540(N−1) will connect DT(N−1) to the output DW(N−1). In this configuration, the consecutive bits DT(0) to DT(N−1) of the multi-bit input data word DT<N−1:0> are mapped by the crossbar switch matrix 220 for k=0 to bits DW(0), DW(1), DW(N−1), respectively, of the multi-bit output data word DW<N−1:0>.

Consider now the multi-bit selection signal Sel<N−1:0> having the value of <0,0, . . . , 1,0>, where only Sel(1)=1 and thus k=1. For n=0 and N=15, the output bit DW(0) will be connected to the input bit DT(14) because (15+0−1/15=0 remainder 14 and thus the modulus is 14). For n=1 and N=15, the output bit DW(1) will be connected to the input bit DT(1) because (15+1−1/15=1 remainder 0 and thus the modulus is 0). The foregoing corresponds to the result noted above where multiplexer 540(0) will connect DT(N−1) to the output DW(0), multiplexer 540(1) will connect DT(0) to the output DW(1), multiplexer 540(N−2) will connect DT(N−3) to the output DW(N−2), and multiplexer 540(N−1) will connect DT(N−2) to the output DW(N−1). In this configuration, the consecutive bits DT(0) to DT(N−1) of the multi-bit input data word DT<N−1:0> are mapped by the crossbar switch matrix 220 for k=1 to bits DW(N−1), DW(0), DW(N−2), respectively, of the multi-bit output data word DW<N−1:0>.

For the multi-bit selection signal Sel<N−1:0> with the value of <0,1, . . . , 0,0>, where only Sel(N−2)=1 and thus k=13. For n=0 and N=15, the output bit DW(0) will be connected to the input bit DT(2) because (15+0−13/15=0 remainder 2 and thus the modulus is 2). For n=1 and N=15, the output bit DW(1) will be connected to the input bit DT(3) because (15+1−13/15=0 remainder 3 and thus the modulus is 3). The foregoing corresponds to the result noted above where multiplexer 540(0) will connect DT(2) to the output DW(0), multiplexer 540(1) will connect DT(3) to the output DW(1), multiplexer 540(N−2) will connect DT(0) to the output DW(N−2), and multiplexer 540(N−1) will connect DT(1) to the output DW(N−1). In this configuration, the consecutive bits DT(0) to DT(N−1) of the multi-bit input data word DT<N−1:0> are mapped by the crossbar switch matrix 220 for k=13 to bits DW(2), DW(3), . . . , DW(1), respectively, of the multi-bit output data word DW<N−1:0>.

Lastly, if the multi-bit selection signal Sel<N−1:0> has the value of <1,0, . . . , 0,0>, where only Sel(N−1)=1 and thus k=14. For n=0 and N=15, the output bit DW(0) will be connected to the input bit DT(1) because (15+0−14/15=0 remainder 1 and thus the modulus is 1). For n=1 and N=15, the output bit DW(1) will be connected to the input bit DT(2) because (15+1−14/15=0 remainder 2 and thus the modulus is 2). The foregoing corresponds to the result noted above where multiplexer 540(0) will connect DT(1) to the output DW(0), multiplexer 540(1) will connect DT(2) to the output DW(1), multiplexer 540(N−2) will connect DT(N−1) to the output DW(N−2), and multiplexer 540(N−1) will connect DT(0) to the output DW(N−1). In this configuration, the consecutive bits DT(0) to DT(N−1) of the multi-bit input data word DT<N−1:0> are mapped by the crossbar switch matrix 220 for k=14 to bits DW(1), DW(2), DW(0), respectively, of the multi-bit output data word DW<N−1:0>.

Figure 6:
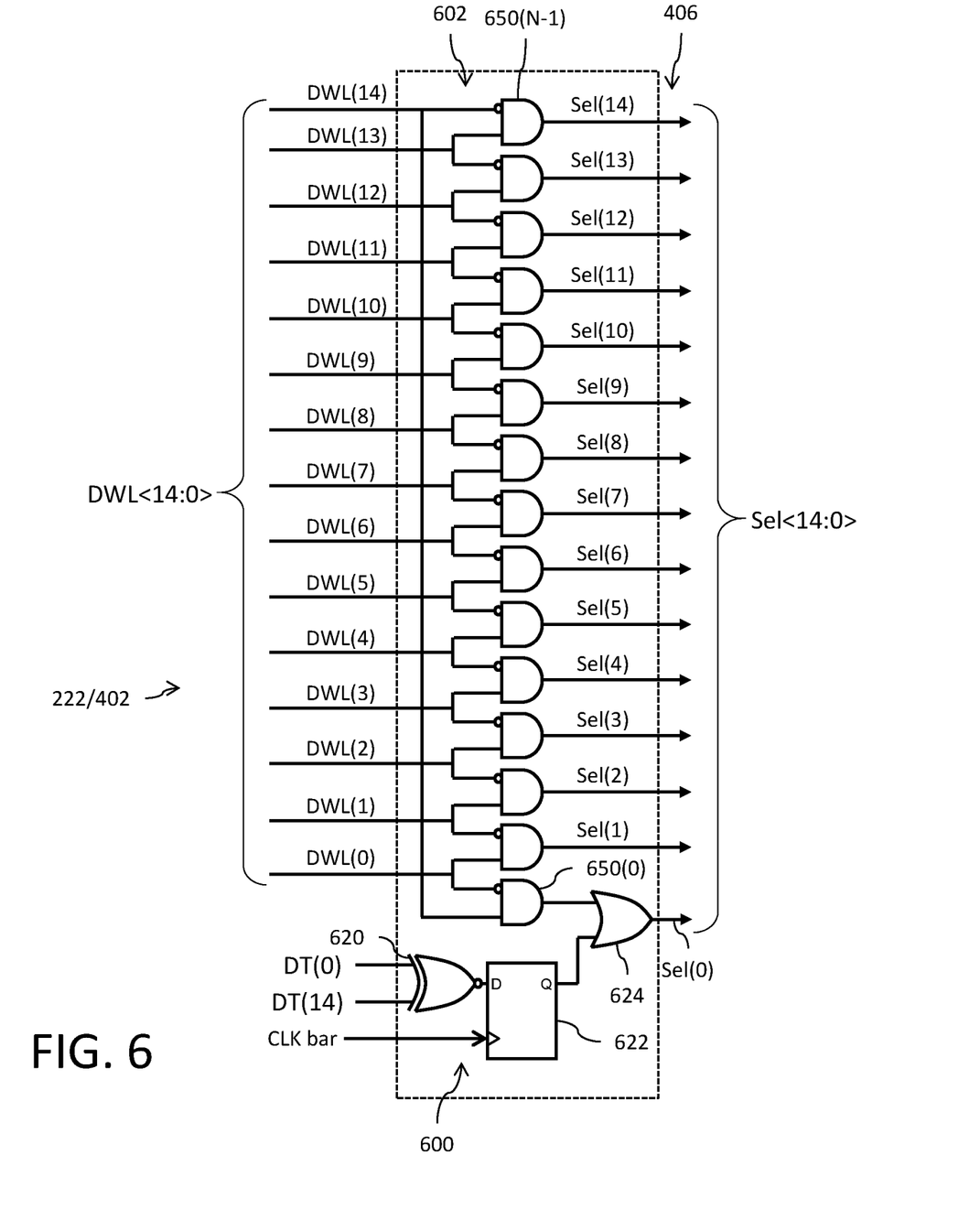
FIG. 6 is a circuit diagram of a DWA control circuit as used in the DWA circuit of the converter circuit shown in FIG. 4, which also functions as a beginning detection circuit of the DWA-to-Binary converter circuit in FIG. 4.

Reference is now made to FIG. 6 showing a circuit diagram for the DWA control circuit 222. The DWA control circuit 222 includes a clocked logic circuit 600 and a combinatorial logic circuit 602. The combinatorial logic circuit 602 is formed by N logical AND gates 650(0) to 650(N−1) operating to generate the multi-bit selection signal Sel<N−1:0> that is applied to control the switching operation of the crossbar switch matrix 220. A first input of each AND gate 650 is connected to a logical inversion of a corresponding bit of the latched multi-bit output data word DWL<N−1:0> output by the register 212. A second input of each AND gate 650 is connected to an adjacent bit of the latched multi-bit output data word DWL<N−1:0>. For example, AND gate 650(0) has a first input connected to receive the logical inversion of corresponding bit DWL(0) and a second input connected to receive adjacent bit DW(N−1), in the example where N=15, this would be bit DWL(14). The output of AND gate 650(0) is an input to the clocked logic circuit 600 which generates an output as one bit (Sel(0)) of the multi-bit input selection signal Sel<N−1:0>. Similarly, AND gate 650(N−1)—in the example where N=15, this would be AND gate 650(14)—has a first input connected to receive the logical inversion of corresponding bit DWL(N−1)—in the example where N=15, this would be bit DWL(14)—and a second input connected to receive adjacent bit DWL(N−2)—in the example where N=15, this would be bit DWL(13). The output of AND gate 650(N−1) provides another bit (Sel(14)) of the multi-bit input selection signal Sel<N−1:0>. The other AND gates 650 are similarly connected to logically inverted bits and adjacent bits of the latched multi-bit output data word DWL<N−1:0> and generate corresponding bits of the multi-bit input selection signal Sel<N−1:0>.

The combinatorial logic circuit 602 operates to identify where the string of logic 1 bits in the received latched multi-bit output data word DWL<N−1:0> transitions to logic 0 from logic 1 and thus identify the bit location where the string of consecutive logic 1 bits in the immediately following N-bit DWA data word DW<N−1:0> will begin. The AND gate 650 whose second input receives that logic 1 value and whose first input receives a logic 0 value from the next adjacent higher bit in the latched multi-bit output data word DWL<N−1:0> will output a logic 1 value. All other AND gates 650 will output a logic low value because at least one of their first or second inputs will receive a logic 0 input. The connection of the AND gate 650(0) to receive the logical inversion of corresponding bit DWL(0) and adjacent bit DWL(N−1) is important because this connection effectuates a wraparound of the bit location finding operation.

The clocked logic circuit 600 includes an exclusive NOR logic gate 620 having a first input receiving the least significant bit (bit 0: DT(0)) of the multi-bit input data word DT<N−1:0> and a second input receiving the most significant bit (bit N−1: DT(N−1)) of the multi-bit input data word DT<N−1:0>. The signal that is output from the exclusive NOR logic gate 620 is applied to the data input of a D-type flip-flop 622 that is clocked by the logical inverse (CLK bar) of the data clock signal CLK. The D-type flip-flop 622 accordingly captures the logic state of the output signal from the exclusive NOR logic gate 620 at the trailing edge of the clock signal CLK and makes that logic state value available at the Q output of the flip-flop 622. An OR logic gate 624 has a first input receiving the Q output of the flip-flop 622 and a second input receiving the output of AND gate 650(0) in the combinatorial logic circuit 602. The signal output by the OR logic gate 624 is the Sel(0) bit of the multi-bit input selection signal Sel<N−1:0>.

The clocked logic circuit 600 operates as follows: the exclusive NOR logic gate 620 determines when the least significant bit (bit 0: DT(0)) and the most significant bit (bit N−1: DT(N−1)) of the multi-bit input data word DT<N−1:0> are either both logic 0 or both logic 1. For thermometer coded data, this occurs only when either all bits of data word DT<N−1:0> are logic 0 or all bits of data word DT<N−1:0> are logic 1. It is critical for the clocked logic circuit 600 to catch this occurrence because when all bits of data word DT<N−1:0> are logic 0 or all bits of data word DT<N−1:0> are logic 1 there will be no transition from 1 to 0 in the data word DW<N−1:0> and thus the AND gates 650 of the combinatorial logic circuit 602 will all output a logic 0 value for the multi-bit input selection signal Sel<N−1:0>. In these two special cases, there will be a deselection of all switches within the crossbar matrix 220 and the signal lines for the data word DW<N−1:0> at the input of the register 212 will be floating. This switch deselection and floating output condition must be avoided.

When the least significant bit (bit 0: DT(0)) and the most significant bit (bit N−1: DT(N−1)) of the multi-bit input data word DT<N−1:0> are either both logic 0 or both logic 1, the logic state of the output signal from the exclusive NOR logic gate 620 is logic 1. This logic state is captured and held by the D-type flip-flop 622 at the trailing edge of the clock signal CLK. In response to the logic 1 output from the flip-flop 622, the OR logic gate 624 will force at least one of the bits of the multi-bit input selection signal Sel<N−1:0> to be logic 1. Any of the bits could be used for this, and the example shown in FIG. 6 uses the OR logic gate 624 connected to the signal line for the Sel(0) bit to force the logic 1 state. In any other combined logic condition of the least significant bit (bit 0: DT(0)) and the most significant bit (bit N−1: DT(N−1)) of the multi-bit input data word DT<N−1:0>, the logic state of the output signal from the exclusive NOR logic gate 620 is logic 0, and this logic state is captured and held by the D-type flip-flop 622 at the trailing edge of the clock signal CLK. The OR logic gate 624 will then permit the logic state of the Sel(0) bit of the multi-bit input selection signal Sel<N−1:0> to follow the logic state of the signal output by the AND gate 650(0) in the combinatorial logic circuit 602.

In response to the trailing edge of the clock signal CLK, the register 212 in the DAC 210 will load the N bits of the multi-bit output data word DW<N−1:0> and output the corresponding N bits of this latched (i.e., preceding) multi-bit output data word DWL<N−1:0> for processing by the logical AND gates 650(0) to 650(N−1) of the combinatorial logic circuit 602 to generate the multi-bit input selection signal Sel<N−1:0>. Because only one AND gate output will have a logic 1 value at a time, this means that only one bit of the multi-bit selection signal Sel<N−1:0> will have a logic 1 value at a time. This one bit of the multi-bit selection signal Sel<N−1:0> that has the logic 1 value specifies the location (reference k, as described above) for controlling the operation of the crossbar switch matrix 220 to connect bits of the multi-bit input data words DT<N−1:0> to bits of the multi-bit output data words DW<N−1:0> in a particular order. Examples of that operation are discussed in detail above. In effect, the location provided by the multi-bit selection signal Sel<N−1:0> identifies the bit location of the immediately following multi-bit output data word DW<N−1:0> where the string of logic 1 bits should begin in order to effectuate data weighted averaging.

The foregoing operation, however, is modified in the case where the least significant bit (bit 0: DT(0)) and the most significant bit (bit N−1: DT(N−1)) of the multi-bit input data word DT<N−1:0> have the same logic state. This condition is detected by the exclusive NOR logic gate 620 of the clocked logic circuit 600 which will force the logic state of the Sel(0) bit to logic 1 in order to ensure that at least one bit of the multi-bit selection signal Sel<N−1:0> will have a logic 1 value.

It will be noted that the functional operation performed by the DWA control circuit 222 to generate the multi-bit selection signal Sel<N−1:0> which identifies the barrel-shifted positional relationship between the sequence of bits of the multi-bit input data word DT<N−1:0> and the sequence of bits of the multi-bit output data words DW<N−1:0> is effectively the same operation that is performed by the first detector circuit 402. Specifically, to identify here the string of logic 1 bits in the received latched multi-bit output data word DWL<N−1:0> transitions to logic 0 from logic 1 and thus identify the bit location where the string of consecutive logic 1 bits in the immediately following N-bit DWA data word DW<N−1:0> will begin. This presents an opportunity for a more efficient process and circuit. Rather than provide a separate circuit for the first detector circuit 402, the DWA-to-Binary converter circuit 216' instead uses the DWA control circuit 222 as the first detector circuit 402 and the multi-bit selection signal Sel<N−1:0> is then also (i.e., additionally) used as the selection signal 406.

Figure 7:
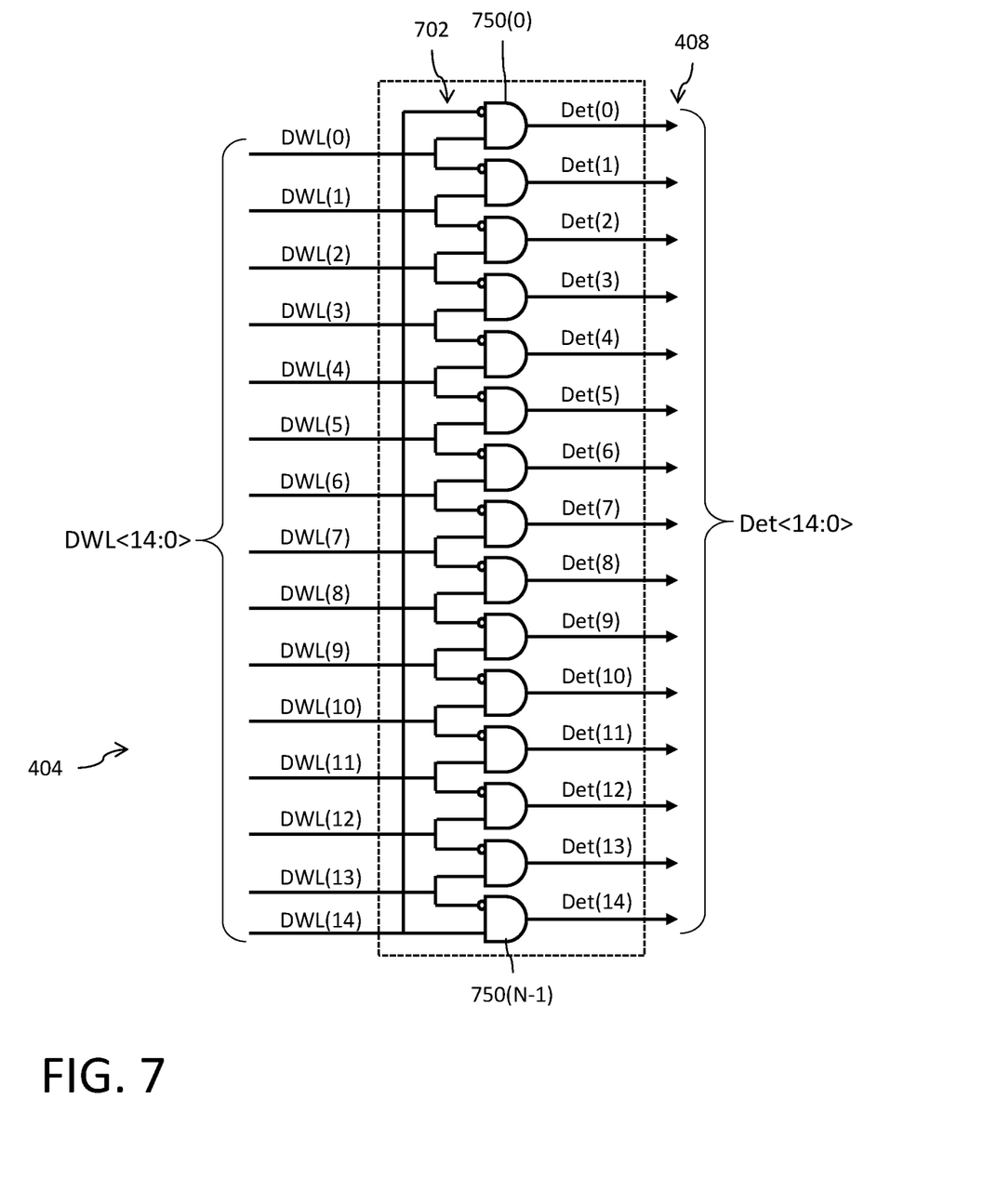
FIG. 7 is a circuit diagram of an ending detection circuit of the DWA-to-Binary converter circuit in FIG. 4.

Reference is now made to FIG. 7 showing a circuit diagram for the second detector circuit 404 of the DWA-to-Binary converter circuit in FIG. 4 which includes a combinatorial logic circuit 702. The combinatorial logic circuit 702 is formed by N logical AND gates 750(0) to 750(N−1) operating to generate a multi-bit detection signal Det<N−1:0> for the selection signal 408. A first input of each AND gate 750 is connected to a corresponding bit of the latched multi-bit output data word DWL<N−1:0> output by the register 212. A second input of each AND gate 650 is connected to a logical inversion of an adjacent bit of the latched multi-bit output data word DWL<N−1:0>. For example, AND gate 750(0) has a first input connected to receive the corresponding bit DWL(0) and a second input connected to receive the logical inversion of adjacent bit DWL(N−1), in the example where N=15, this would be bit DWL(14). The output of AND gate 750(0) generates one bit (Det(0)) of the detection signal Det<N−1:0> 406. Similarly, AND gate 750(N−1)—in the example where N=15, this would be AND gate 750(14)—has a first input connected to receive the corresponding bit DWL(N−1)—in the example where N=15, this would be bit DWL(14)—and a second input connected to receive the logic inversion of adjacent bit DWL(N−2)—in the example where N=15, this would be bit DWL(13). The output of AND gate 750(N−1) provides another bit (Det(14)) of the detection signal Det<N−1:0> 406. The other AND gates 750 are similarly connected to logically inverted bits and adjacent bits of the latched multi-bit output data word DWL<N−1:0> and generate corresponding bits of the detection signal Det<N−1:0> 406.

The combinatorial logic circuit 702 operates to identify where the string of logic 1 bits in the received latched multi-bit output data word DWL<N−1:0> transitions from logic 1 to logic 0 and thus identify the bit location where the string of consecutive logic 1 bits ends. The AND gate 750 whose first input receives that logic 1 value and whose second input receives a logic 0 value from the next adjacent lower bit in the latched multi-bit output data word DWL<N−1:0> will output a logic 1 value. All other AND gates 750 will output a logic low value because at least one of their first or second inputs will receive a logic 0 input. The connection of the AND gate 750(0) to receive the corresponding bit DWL(0) and logical inversion of the adjacent bit DWL(N−1) is important because this connection effectuates a wrap-around of the bit location finding operation.

In response to the trailing edge of the clock signal CLK, the register 212 will load the N bits of the multi-bit output data word DW<N−1:0> and output the corresponding N bits of this latched multi-bit output data word DWL<N−1:0> for processing by the logical AND gates 750(0) to 750(N−1) of the combinatorial logic circuit 702 to generate the detection signal Det<N−1:0> 406. Because only one AND gate output will have a logic 1 value at a time, this means that only one bit of the detection signal Det<N−1:0> will have a logic 1 value at a time. This one bit of the detection signal Det<N−1:0> that has the logic 1 value specifies the location where the string of logic 1 bits ends.

Figure 8:
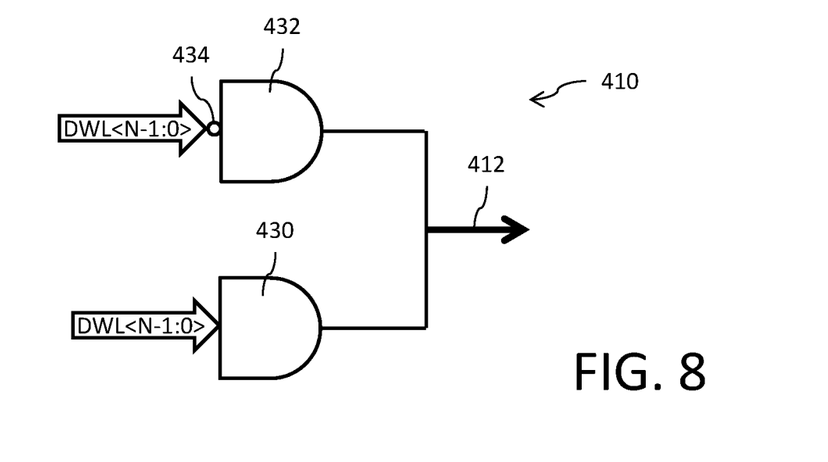
FIG. 8 is a circuit diagram of an all 1/0 detection circuit of the DWA-to-Binary converter circuit in FIG. 4.

Reference is now made to FIG. 8 showing a circuit diagram for the third detector circuit 410 of the DWA-to-Binary converter circuit in FIG. 4. The circuit 410 includes a first logic circuit, for example using a first logic-AND gate 430 having inputs coupled to receive the bits of the multi-bit output data word DWL<N−1:0>, to detect whether all bits of the latched multi-bit output data word DWL<N−1:0> are logic 1. The output of the first logic-AND gate is logic 1 in that case. The circuit 410 further includes a second logic circuit, for example using a second logic-AND gate 432 having all inputs coupled to receive a logically complemented 434 version of the latched multi-bit output data word DWL<N−1:0>, to detect whether all bits of the latched multi-bit output data word DWL<N−1:0> are logic 0. The output of the second logic-AND gate is logic 1 in that case. The two bits generated by the circuit 410 provide the all logic 1/0 bit detection signal 412.

Figure 9:
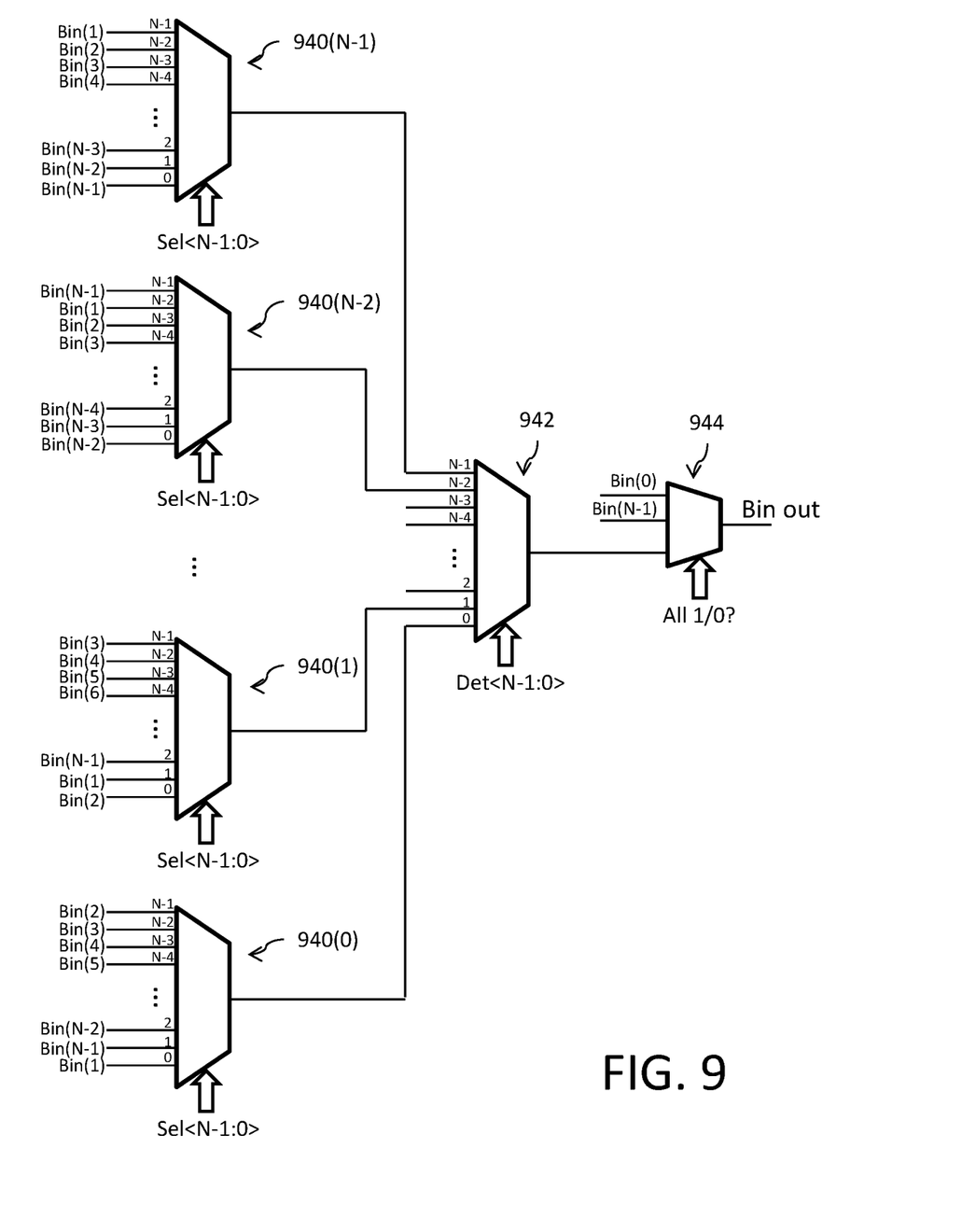
FIG. 9 is a circuit diagram of the selection logic circuit of the DWA-to-Binary converter circuit in FIG. 4.

Reference is now made to FIG. 9 showing a circuit diagram for the selection logic circuit 414 of the DWA-to-Binary converter circuit in FIG. 4. The selection logic circuit 414 includes a set of N first multiplexers 940(0) to 940(N−1), wherein each multiplexer 940 is an N:1 multiplexer. The N inputs of each multiplexer 940 receive a set of binary values which represent the set of possible number of non-zero logic 1 bits that may occur in the latched multi-bit output data word DWL<N−1:0>. So, as an example where N=15, the set of binary values would range from Bin(1)=<0,0,0,1> to Bin(15)=<1,1,1,1>, and are identified as Bin(1), Bin(2), Bin(N−2), Bin(N−1). The selection control input of each multiplexer 940 receives the multi-bit selection signal Sel<N−1:0>, which as discussed previously identifies the bit location of the multi-bit output data word DW<N−1:0> where the string of logic 1 bits begins for data weighted averaging. It will be noted that the wrap around sequence order for the set of binary values at the inputs of each multiplexer is different. As an example, for multiplexer 940(N−1), the order of the set of binary values at the input is Bin(N−1), Bin(N−2), . . . , Bin(1). For multiplexer 940(N−2), the order of the set of binary values at the input is Bin(N−2), Bin(N−3), Bin(1), DT(N−1). For multiplexer 940(1), the order of the set of binary values at the input is Bin(2), Bin(1), Bin(N−1), Bin(4), Bin(3). For multiplexer 940(0), the order of the set of binary values at the input is Bin(1), Bin(N−1), Bin(N−2), Bin(3), Bin(2). Those skilled in the art will recognize that the connection of the set of binary values is effectively barrel-shifted across the N multiplexers 940(0) to 940(N−1).

The DWA control circuit 222 generates the multi-bit selection signal Sel<N−1:0> in a manner such that only one bit of the N bits in the selection signal can be asserted (for example, at logic 1) at a time, while all other bits are deasserted (for example, at logic 0). The N multiplexers 940(0) to 940(N−1) respond to the asserted bit of the multi-bit selection signal Sel<N−1:0> by selectively connecting the multiplexer input (reference numbers 0 to N−1) which corresponds to the asserted bit to the multiplexer output. The single asserted bit of the multi-bit selection signal Sel<N−1:0> specifies the barrel-shifted positional relationship of the sets of binary values at the inputs of the multiplexers 940.

The effect of this is that the set of N first multiplexers 940(0) to 940(N−1) operates to selectively output a sequence of binary numbers representing the possible number of non-zero logic 1 bits in the latched multi-bit output data word DWL<N−1:0> based on the identified bit location of the multi-bit output data word DW<N−1:0> where the string of logic 1 bits begins. This may be better understood by considering an example. Assume that the multi-bit selection signal Sel<N−1:0> has a value of <0,0,0,0,0, . . . ,0,1,0,0>, where N=15, which identifies that the 3rd bit (DW(2)) is the location in the multi-bit output data word DW<N−1:0> where the string of logic 1 bits begins. The set of N first multiplexers 940(0) to 940(N−1) will respond to the multi-bit selection signal Sel<N−1:0> by passing the binary value at the third input to the output. So, multiplexer 940(N−1) will output Bin(13), multiplexer 940(N−2) will output Bin(12), . . . , multiplexer 940(1) will output Bin(15) and multiplexer 940(0) will output Bin(14).

The selection logic circuit 414 of the DWA-to-Binary converter circuit further includes a second multiplexer 942 having each of its N inputs coupled to the output of a corresponding one of the N first multiplexers 940(0) to 940(N−1). So, the first input of second multiplexer 942 is coupled to the output of the multiplexer 940(0), the second input of second multiplexer 942 is coupled to the output of the multiplexer 940(1), . . . , the N−2-th input of second multiplexer 942 is coupled to the output of the multiplexer 940(N−2), and the N−1-th input of second multiplexer 942 is coupled to the output of the multiplexer 940(N−1). The selection control input of the multiplexer 942 receives the detection signal Det<N−1:0> 406, which as discussed previously identifies the bit location of the multi-bit output data word DW<N−1:0> where the string of logic 1 bits ends. The multiplexer 942 operates to select one of the sequence of binary numbers representing the possible number of non-zero logic 1 bits in the latched multi-bit output data word DWL<N−1:0> based on the identified bit location of the detection signal Det<N−1:0> 406 where the string of logic 1 bits ends. That selected binary number represents the number of logic 1 bits that are included in the latched multi-bit output data word DWL<N−1:0>.

The operation of the set of N first multiplexers 940(0) to 940(N−1) and the second multiplexer 942 may be better understood by considering a specific example. In this case, the latched multi-bit output data word DWL<N−1:0> has a value of <0,1,1,1,1,1,1,1,1,1,1,1,1,1,0>, and so the multi-bit selection signal Sel<N−1:0> would have a value of <0,0,0, 0,0, . . . ,0,1,0> identifying that the 2nd bit (DW(1)) as the location in the multi-bit output data word DW<N−1:0> where the string of logic 1 bits begins, and the detection signal Det<N−1:0> 406 would have a value of <0,1, 0, . . . , 0,0,0,0> identifying the 14th bit (DW(13)) as the location in the multi-bit output data word DW<N−1:0> where the string of logic 1 bits ends. A count of the logic 1 bits in the latched multi-bit output data word DWL<N−1:0> is thirteen. The second multiplexer 942 responds to the detection signal Det<N−1:0> 406 having a value of <0,1, 0, . . . , 0,0,0,0> by passing the 14th input to the output. The 14th input of second multiplexer 942 is coupled to the output of the multiplexer 940(14) (i.e., 940(N−2)). The multiplexer 940(14) responds to the multi-bit selection signal Sel<N−1:0> having a value of <0,0,0,0,0,0, . . . 0,1,0> by passing the 2nd input to the output. The 2nd input of multiplexer 940(14) receives a value of Bin(N−3) and where N=15 this would be Bin(13) thus identifying that the latched multi-bit output data word DWL<N−1:0> includes thirteen logic 1 bits.

As a further example, consider the case where the logic 1 bits in the latched multi-bit output data word DWL<N−1:0> wrap around. If the latched multi-bit output data word DWL<N−1:0> has a value of <1,1,0,0,0,0,0,0,0,0,0,0,0,1, 1>, for example, the multi-bit selection signal Sel<N−1:0> would have a value of <0,1,0,0,0, . . . ,0,0,0> identifying that the 14th bit (DW(13)) as the location in the multi-bit output data word DW<N−1:0> where the string of logic 1 bits begins, and the detection signal Det<N−1:0> 406 would have a value of <0,0,0, . . . , 0,1,0> identifying the 2nd bit (DW(1)) as the location in the multi-bit output data word DW<N−1:0> where the string of logic 1 bits ends. A count of the logic 1 bits in the latched multi-bit output data word DWL<N−1:0> is four. The second multiplexer 942 responds to the detection signal Det<N−1:0> 406 having a value of <0,0,0, . . . , 0,1,0> by passing the 2nd input to the output. The 2nd input of second multiplexer 942 is coupled to the output of the multiplexer 940(1). The multiplexer 940(1) responds to the multi-bit selection signal Sel<N−1:0> having a value of <0,1,0,0,0, . . . ,0,0,0> by passing the 14th input to the output. The 14th input of multiplexer 940(1) receives a value of Bin(4) thus identifying that the latched multi-bit output data word DWL<N−1:0> includes four logic 1 bits.

The selection logic circuit 414 of the DWA-to-Binary converter circuit further includes a third multiplexer 944 having a first input coupled to receive the output from the second multiplexer 942, a second input receiving the binary value Bin(N−1) (i.e., the maximum binary value) and a third input receiving the binary value Bin(0) (i.e., the minimum or zero binary value). The selection control input of the multiplexer 944 receives the all logic 1/0 bit detection signal 412, which as discussed previously identifies the existence of the special cases where all bits of the latched multi-bit output data word DWL<N−1:0> are either logic 1 or logic 0. If the all logic 1/0 bit detection signal 412 does not identify that one of these special cases exists, the third multiplexer 944 passes the binary value output from the second multiplexer 942 as the binary output (Bin out). However, if the all logic 1/0 bit detection signal 412 identifies existence of the special case where all bits of the latched multi-bit output data word DWL<N−1:0> are logic 1, the binary value Bin(N−1) at the second input is passed as the binary output (Bin out). Furthermore, if the all logic 1/0 bit detection signal 412 identifies existence of the special case where all bits of the latched multi-bit output data word DWL<N−1:0> are logic 0, the binary value Bin(0) at the second input is passed as the binary output (Bin out).

Although the preceding description has been described herein with reference to particular circuits and embodiments, it is not intended to be limited to the particulars disclosed herein; rather, it extends to all functionally equivalent structures, methods, and uses, such as are within the scope of the appended claims.

The invention claimed is:

1. A circuit for converting a data weighted averaging (DWA) data word into a binary word, comprising:
   a first detector circuit configured to identify a first bit location in said DWA data word where a string of logic 1 bits begins;
   a second detector circuit configured to identify a second bit location in said DWA data word where said string of logic 1 bits ends; and
   a logic circuit comprising:
      a plurality of first multiplexers, each first multiplexer having a selection input receiving said first bit location and each first multiplexer having inputs receiving a different order of binary values which represent possible numbers of logic 1 bits present in the DWA word; and
      a second multiplexer having inputs coupled to outputs of the first multiplexers of said plurality of first multiplexers and having a selection input receiving said second bit location.

2. The circuit of claim 1, further comprising:
   a third detector circuit configured to identify whether all bits of said DWA data word are logic 0; and
   a third multiplexer having a first input coupled to an output of the second multiplexer and a second input receiving a binary zero value and having a selection input receiving an all logic 0 identification output from the third detector circuit, the third multiplexer passing the second input in response to the all logic 0 identification.

3. The circuit of claim 1, further comprising:
   a third detector circuit configured to identify whether all bits of said DWA data word are logic 1; and
   a third multiplexer having a first input coupled to an output of the second multiplexer and a second input receiving a maximum binary value and having a selection input receiving an all logic 1 identification output from the third detector circuit, the third multiplexer passing the second input in response to the all logic 1 identification.

4. The circuit of claim 1, wherein the order of binary values which represent possible numbers of logic 1 bits present in the DWA word is barrel shifted across the first multiplexers of said plurality of first multiplexers.

5. A method, comprising:
   receiving a data weighted averaging (DWA) data word;
   identifying a first bit location in said DWA data word where a string of logic 1 bits begins;
   identifying a second bit location in said DWA data word where said string of logic 1 bits ends;
   selecting a sequence of binary values which represent possible numbers of logic 1 bits present in the DWA word starting from the identified first bit location;
   choosing one binary value from said sequence using the identified a second bit location; and
   outputting the chosen binary value as a binary word identifying a number of logic 1 bits which are present in said DWA data word.

6. The method of claim 5, further comprising:
identifying whether all bits of said DWA data word are logic 0; and
if all bits are identified as logic 0, then outputting a binary zero value as the binary word.

7. The method of claim 5, further comprising:
identifying whether all bits of said DWA data word are logic 1; and
if all bits are identified as logic 1, then outputting a binary maximum value as the binary word.

8. A method, comprising:
receiving a first data weighted averaging (DWA) data word;
processing said first DWA data word to identify a first bit location associated with an ending of a first string of logic 1 bits in said first DWA data word;
generating a second DWA data word including a second string of logic 1 bits that begins at said first bit location;
processing said second DWA data word to identify a second bit location associated with an ending of the second string of logic 1 bits in said second DWA data word;
using the first bit location and second bit location to identify a number of logic 1 bits present in said second DWA data word; and
outputting a binary value which is equal to said identified number.

9. The method of claim 8, wherein using comprises:
generating from the first bit location a sequence of binary values which represent possible numbers of logic 1 bits present in the second DWA word starting from the first bit location; and
selecting one binary value from said sequence using the second bit location;
wherein outputting comprises outputting the selected binary value.

10. The method of claim 8, further comprising:
identifying whether all bits of said second DWA data word are logic 0; and
wherein outputting comprises, if all bits are identified as logic 0, outputting a binary zero value.

11. The method of claim 8, further comprising:
identifying whether all bits of said second DWA data word are logic 1; and
therein outputting comprises, if ail bits are identified as logic 1, outputting a binary maximum value.

12. A circuit, comprising:
a latch circuit configured to first latch a first data weighted averaging (DWA) data word and then second latch a second DWA data word;
a first detector circuit configured to identify a first bit location in said first DWA data word associated with an ending of a first string of logic 1 bits in said first DWA data word;
a second detector circuit configured to identify a second bit location in said second DWA data word associated with an ending of a second string of logic 1 bits in said second DWA data word; and
a DWA-to-binary conversion circuit configured to convert the second DWA data word to a binary word by using the first bit location and second bit location to identify a number of logic 1 bits present in said second DWA data word and outputting a binary value for said binary word which is equal to said identified number.

13. The circuit of claim 12, further including a plurality of unary output elements selectively actuated by bits of the first and second DWA data words to generate corresponding first and second analog voltages.

14. The circuit of claim 13, Therein the latch circuit and plurality of unary output elements are components of a digital-to-analog converter (DAC) circuit.

15. The circuit of claim 14, further comprising:
a summation circuit configured to receive an input analog voltage and a feedback analog voltage derived from at least one of said first and second analog voltage and generate a difference analog voltage;
a loop filter configured to filter the difference analog voltage to generate a filtered analog voltage; and
a quantization circuit configured to quantize the filtered analog voltage to generate thermometer data words.

16. The circuit of claim 15, further comprises a DWA circuit having an input receiving the thermometer data words and an output generating the DWA data words.

17. The circuit of claim 12, further comprises a DWA circuit having an input receiving thermometer data words and an output generating DWA data words, wherein said first detector circuit is a control circuit of said DWA circuit configured to utilize the first bit location in selecting a starting bit location for the second string of logic 1 bits of the second DWA data word.

18. The circuit of claim 17, wherein the first bit location and the starting hit location are a same bit location.

19. The circuit of claim 17, wherein the DWA circuit comprises a crossbar switch matrix selectively coupling bits of each thermometer data word and bits of each DWA data word in response to said first bit location.

20. The circuit of claim 12, further comprising:
a third detector circuit configured to identify whether all bits of said second DWA data word are logic 0; and
wherein said DWA-to-binary conversion circuit is further configured generate a binary zero value as said binary value for said binary word if the third detector circuit identifies that all bits of said second DWA data word are logic 0.

21. The circuit of claim 12, further comprising:
a third detector circuit configured to identify whether all bits of said second DWA data word are logic 1; and
wherein said DWA-to-binary conversion circuit is further configured generate a maximum binary value as said binary value for said binary word if the third detector circuit identifies that all bits of said second DWA data word are logic 1.

22. The circuit of claim 12, wherein the DWA-to-binary conversion circuit comprises:
a plurality of first multiplexers, each first multiplexer having a selection input receiving said first bit location and each first multiplexer having inputs receiving a different order of binary values which represent possible numbers of logic 1 bits present in the second DWA word; and
a second multiplexer having inputs coupled to outputs of the first multiplexers of said plurality of first multiplexers and having a selection input receiving said second bit location.

23. The circuit of claim 22, further comprising a third detector circuit configured to identify whether all bits of said DWA data word are logic 0, and wherein the DWA-to-binary conversion circuit further comprises:
a third multiplexer having a first input coupled to an output of the second multiplexer and a second input receiving a binary zero value and having a selection input receiving an all logic 0 identification output from the third detector circuit, the third multiplexer passing the second input in response to the all logic 0 identification.

24. The circuit of claim 22, further comprising a third detector circuit configured to identify whether all bits of said DWA data word are logic 1, and wherein the DWA-to-binary conversion circuit further comprises:

a third multiplexer having a first input coupled to an output of the second multiplexer and a second input receiving a maximum binary value and having a selection input receiving an all logic 1 identification output from the third detector circuit, the third multiplexer passing the second input in response to the all logic 1 identification.

25. The circuit of claim 22, Therein the order of binary values which represent possible numbers of logic 1 bits present in the second DWA word is barrel shifted across the first multiplexers of said plurality of first multiplexers.

* * * * *